(12) United States Patent
Fonteneau

(10) Patent No.: US 9,354,391 B2
(45) Date of Patent: May 31, 2016

(54) OVERVOLTAGE PROTECTION COMPONENT AND AN ASSEMBLY OF INTEGRATED CIRCUIT CHIPS HAVING SAID OVERVOLTAGE PROTECTION COMPONENT

(71) Applicant: STMicroelectronics SA, Montrouge (FR)

(72) Inventor: Pascal Fonteneau, Theys (FR)

(73) Assignee: STMicroelectronics SA, Montrouge (FR)

( * ) Notice: Subject to any disclaimer, the term of this patent is extended or adjusted under 35 U.S.C. 154(b) by 0 days.

(21) Appl. No.: 14/494,647

(22) Filed: Sep. 24, 2014

(65) Prior Publication Data

US 2015/0086154 A1    Mar. 26, 2015

(30) Foreign Application Priority Data

Sep. 26, 2013    (FR) ...................... 13 59286

(51) Int. Cl.
| | |
|---|---|
| *G02B 6/12* | (2006.01) |
| *G02B 6/122* | (2006.01) |
| *H01L 25/16* | (2006.01) |
| *H01L 27/02* | (2006.01) |
| *H01L 23/60* | (2006.01) |
| *H01L 25/065* | (2006.01) |
| *H01L 23/00* | (2006.01) |

(52) U.S. Cl.
CPC ............... *G02B 6/122* (2013.01); *H01L 23/60* (2013.01); *H01L 25/0652* (2013.01); *H01L 25/167* (2013.01); *H01L 27/0248* (2013.01); *G02B 2006/12061* (2013.01); *H01L 24/16* (2013.01); *H01L 2224/16235* (2013.01); *H01L 2225/06534* (2013.01); *H01L 2225/06572* (2013.01); *H01L 2924/10253* (2013.01); *H01L 2924/1431* (2013.01)

(58) Field of Classification Search
CPC .... H01L 2924/00; H01L 25/167; G02B 6/43; G02B 6/4214; G02B 6/122; G02B 6/12
USPC ................................... 385/14, 15, 16, 24, 27
See application file for complete search history.

(56) References Cited

U.S. PATENT DOCUMENTS

| | | | |
|---|---|---|---|
| 9,240,394 B1 * | 1/2016 | Ben Jamaa | H01L 25/50 |
| 2003/0113067 A1 * | 6/2003 | Koh | G02B 6/12004 385/48 |

(Continued)

FOREIGN PATENT DOCUMENTS

WO    WO-2009057983 A2    5/2009

OTHER PUBLICATIONS

INPI Search Report and Written Opinion for FR1359286 dated Jun. 12, 2014 (7 pages).

*Primary Examiner* — Jennifer Doan
(74) *Attorney, Agent, or Firm* — Gardere Wynne Sewell LLP

(57) ABSTRACT

A device includes integrated circuit chips mounted on one another. At least one component for protecting elements of a second chip is formed in a first chip. The chips may be of the SOI type, with the first chip including a first SOI layer having a first thickness and the second chip including a second SOI layer having a second thickness smaller than the first thickness. The first chip including the component for protecting may include an optical waveguide with the component for protecting formed adjacent the optical waveguide.

26 Claims, 6 Drawing Sheets

(56) References Cited

U.S. PATENT DOCUMENTS

| | | |
|---|---|---|
| 2009/0294814 A1 | 12/2009 | Assefa et al. |
| 2012/0049214 A1 | 3/2012 | Lowes et al. |
| 2012/0153433 A1 | 6/2012 | Yen et al. |

* cited by examiner

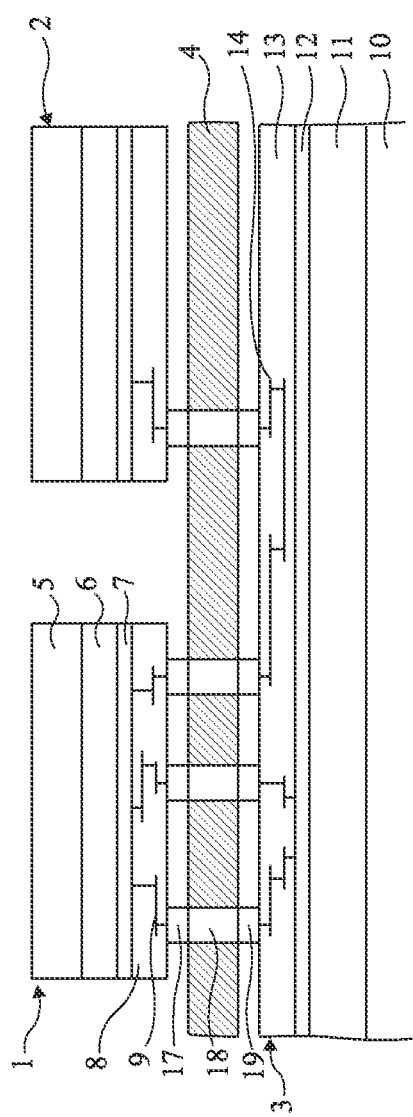

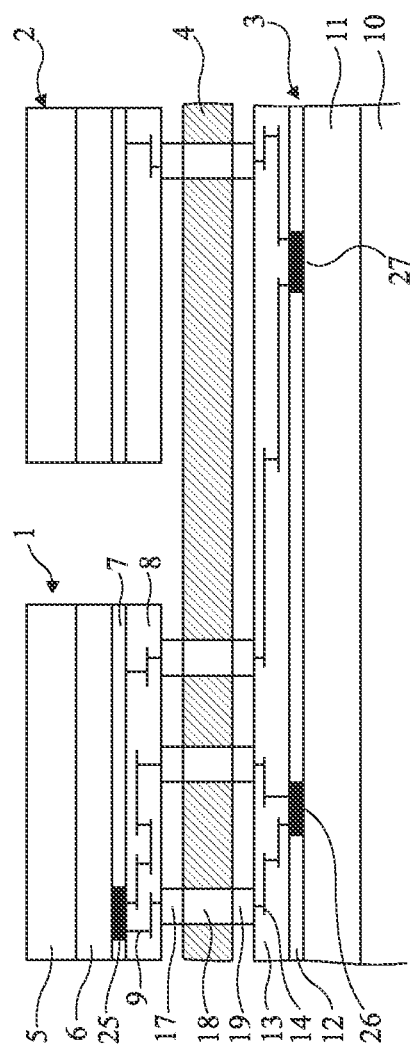

OVERVOLTAGE PROTECTION COMPONENT AND AN ASSEMBLY OF INTEGRATED CIRCUIT CHIPS HAVING SAID OVERVOLTAGE PROTECTION COMPONENT

CROSS REFERENCE TO RELATED APPLICATIONS

This application claims the priority benefit of French Patent application number 1359286, filed on Sep. 26, 2013, which is hereby incorporated by reference to the maximum extent allowable by law.

TECHNICAL FIELD

The present disclosure relates to an integrated circuit chip assembly comprising an overvoltage protection component.

BACKGROUND

FIG. 1 illustrates an example of an integrated circuit chip assembly. Two chips 1 and 2, respectively to the left and to the right of the drawing, are assembled on a chip 3 and are separated therefrom by a silicon interposer plate 4.

Chip 1, as well as chip 2, comprises a silicon substrate 5 coated with a silicon oxide layer 6, itself coated with a silicon layer 7. Silicon layer 7, currently designated as SOI (Silicon on Insulator), is coated with an interconnection structure 8 comprising several metallization levels 9 separated by insulating layers.

Chip 3 comprises a silicon substrate 10 coated with a silicon oxide layer 11, itself coated with an SOI layer 12. SOI layer 12 is coated with an interconnection structure 13 comprising several metallization levels 14 separated by insulating layers.

Interconnection structures 8 of chips 1 and 2 are arranged opposite to interconnection structures 13 of chip 3.

In SOI layers 7 are formed electronic components, not shown, for example, logic components. Some of these electronic components are interconnected via external pads 17 of interconnection structures 8, connected to ends of vias 18, vias 18 being connected to external pads 19 of interconnection structure 13 and crossing interposer plate 4.

Optoelectronic components, not shown, are formed in SOI layer 12 of chip 3.

FIGS. 2A and 2B are respectively a top view and a cross-section view along plane BB of a portion of an optical waveguide formed in SOI layer 12 of chip 3 of FIG. 1. Lightly-doped P-type SOI layer 12 (P−) comprises a portion entirely surrounded with silicon oxide, which forms core 20 of the optical waveguide. Core 20 resting on oxide layer 11 is laterally delimited by two wafers 21 filled with oxide crossing SOI layer 12 and is covered with an upper oxide layer. In the shown example, the upper oxide layer comprises a central portion 23 surrounded with two lateral portions 24 deeper than central portion 23. Central portion 23, which is shallower, for example results from a thermal oxidation, and lateral portions 24 for example correspond to trenches filled with oxide which do not cross SOI layer 12.

For switching speed and bulk reasons, the electronic components of chips 1 and 2 are formed in very thin SOI layers 7 having thicknesses for example in the range from 5 to 10 nm.

It is desired to protect some at least of the electronic components of chips 1 and 2 against overvoltages, for example, during an electrostatic discharge capable of occurring while chips 1 and 2 comprising the components to be protected are still unconnected. Generally, a protection component connected across the component to be protected is used. Such a protection component may for example be an avalanche diode, a bipolar transistor, or a unidirectional or bidirectional Shockley diode.

It would be desirable to include the protection components in SOI layer 7 where the component to be protected is formed. However, given the small thickness of SOI layer 7, a protection component formed in this layer would be damaged or destroyed by the currents capable of flowing on occurrence of an overvoltage.

Thereby, electronic integrated circuit components formed in very thin SOI layers result having to be protected by discrete external protection components. Such discrete external protection components are, for example, mounted on a printed circuit having the integrated circuit containing the component to be protected mounted thereon.

The need to use discrete external protection components results in bulk and assembly cost issues.

A device of protection against overvoltages of elements formed in a thin SOI layer is thus needed.

SUMMARY

Thus, an embodiment provides a device comprising integrated circuit chips mounted on one another, wherein at least one component for protecting elements of at least one second chip is formed in a first chip.

According to an embodiment, the chips are of SOI type, the first chip comprising a first SOI layer having a first thickness, said at least one second chip comprising a second SOI layer having a second thickness smaller than the first thickness.

According to an embodiment, the first chip and said at least one second chip are placed directly against each other.

According to an embodiment, the first chip and said at least one second chip are appended with an interposed interposer plate, the surfaces of each of the chips which support an SOI layer being opposite.

According to an embodiment, the integrated circuits of the first chip comprise optoelectronic components and the integrated circuits of said at least one second chip are of electronic type.

According to an embodiment, at least one of the protection components is connected to terminals of different chips.

According to an embodiment, said at least one protection component is formed in the first SOI layer and comprises a first region of a first conductivity type and a second region and a third region of the second conductivity type arranged on either side of the first region, the first region, the second region, and the third region altogether forming a bipolar transistor.

According to an embodiment, said at least one protection component is formed in the first SOI layer and comprises a first region of a first conductivity type, a second region and a fourth region respectively of the second conductivity type and of the first conductivity type successively arranged on one side of the first region, and a third region of the second conductivity type arranged on the other side of the first region, the first region, the second region, the third region, and the fourth region altogether forming a unidirectional Shockley diode.

According to an embodiment, said at least one protection component is formed in the first SOI layer and comprises a first region of a first conductivity type, a second region and a fourth region respectively of the second conductivity type and of the first conductivity type successively arranged on one side of the first region, and a third region and a fifth region respectively of the second conductivity type and of the first conductivity type successively arranged on the other side of the first region, the first region, the second region, the third region, the fourth region, and the fifth region altogether forming a bidirectional Shockley diode.

According to an embodiment, the first region is a portion at least of the core of a waveguide formed in said first SOI layer.

The foregoing and other features and advantages will be discussed in detail in the following non-limiting description of specific embodiments in connection with the accompanying drawings.

BRIEF DESCRIPTION OF THE DRAWINGS

FIG. 1 is a cross-section view of an assembly of two integrated electronic circuit chips and of an integrated optoelectronic circuit chip;

FIG. 3 is a cross-section view of an embodiment of an assembly of two integrated electronic circuit chips and of an integrated optoelectronic circuit chip comprising protection components;

For clarity, the same elements have been designated with the same reference numerals in the various drawings and, further, as usual in the representation of integrated circuits, the various drawings are not to scale.

DETAILED DESCRIPTION

Figure 2A:
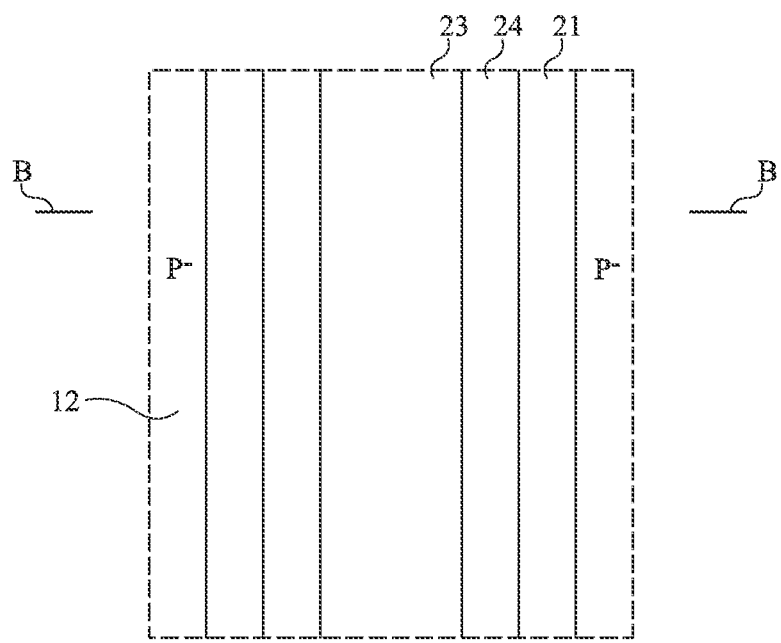
FIG. 2A is a top view of a portion of a waveguide.

The case of an integrated circuit chip comprising electronic components formed in an SOI layer of very small thickness (thickness in the range from 5 to 10 nm) is here considered. This chip is mounted on a chip comprising optoelectronic components formed in an SOI layer, the SOI layer which comprises the optoelectronic components being much thicker (with a thickness in the range from 200 to 400 nm) than the SOI layer comprising the electronic components. It is here provided to form protection components in the thickest SOI layer, that is, that comprising the optoelectronic components, to protect against overvoltages elements formed in the thinnest SOI layer.

FIG. 3 is a cross-section view of an embodiment of an assembly of integrated circuit chips. The assembly of FIG. 3 is similar to the assembly of FIG. 1. It comprises two chips 1 and 2, respectively to the left and to the right of the drawing, mounted on a chip 3 and separated therefrom by an interposer plate 4. Chips 1, 2, and 3 are respectively identical to chips 1, 2, and 3 shown in FIG. 1 and comprise the same elements. Chips 1 and 2 comprise a substrate 5, an insulating layer 6, an SOI layer 7, and an interconnection structure 8 comprising different metallization levels 9. Chip 3 comprises a substrate 10, an insulating layer 11, and SOI layer 12, and an interconnection structure 13 comprising different metallization levels 14.

SOI layer 7 of chips 1 and 2 containing electronic components, for example, logic components, is as thin as possible, for example, with a thickness between 5 and 10 nm in current technologies. SOI layer 12 of the chip containing optoelectronic components, for example, the waveguide described in relation with FIGS. 2A and 2B, should have a thickness in the order of one quarter of the operating wavelength, for example, a thickness in the range from 200 to 400 nm. Thereby, a protection component formed in SOI layer 12 can stand a strong current capable of flowing on occurrence of an electrostatic discharge, without being destroyed or damaged.

An element 25 to be protected against overvoltages of chip 1 is connected across a protection component 26 formed in SOI layer 12 of chip 3 via external pads 17 of interconnection structures 8, connected to ends of vias 18, vias 18 being connected to external pads 19 of the interconnection structure and crossing interposer plate 4.

A protection component 27 formed in chip 3 is connected, on the one hand, to a terminal of chip 1 and, on the other hand, to a terminal of chip 2. Component 27 protects elements of chips 1 and 2 against differential overvoltages capable of occurring between a terminal of chip 1 and a terminal of chip 2.

Although only one element to be protected 25 and two protection components 26 and 27 have been shown, it should be noted that many other protection components may be formed in SOI layer 12 to form the protections necessary for elements comprised in SOI layers 7.

Figure 4A:
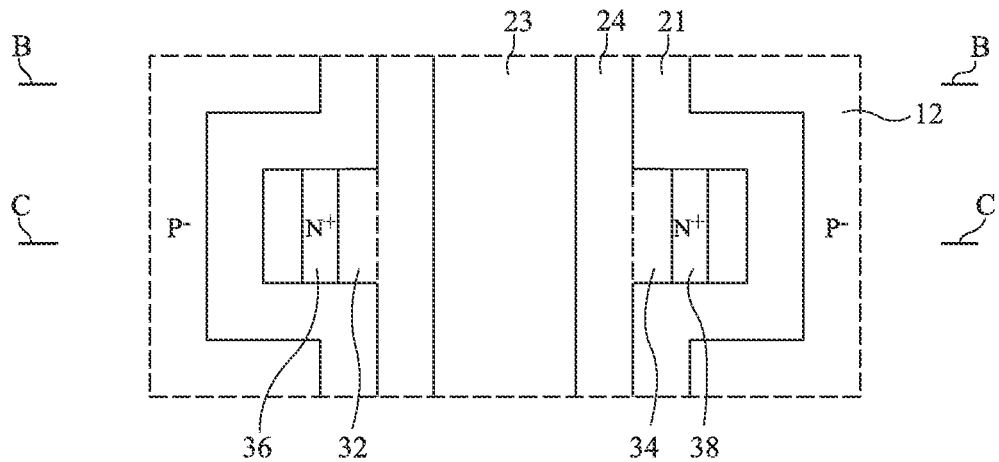
FIG. 4A is a top view of an embodiment of a protection component of bipolar transistor type.
Figure 4B:
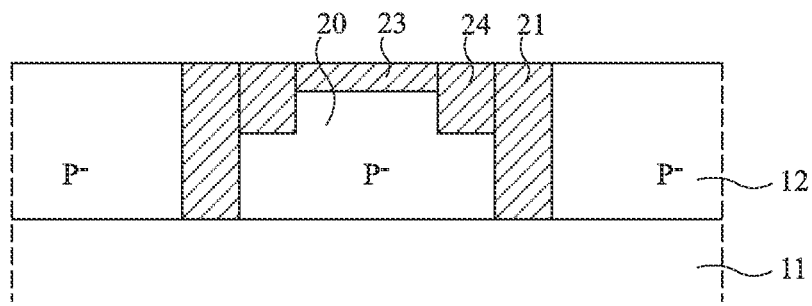
FIGS. 4B and 4C are cross-section views of FIG. 4A along plane BB and plane CC, respectively.
Figure 4C:
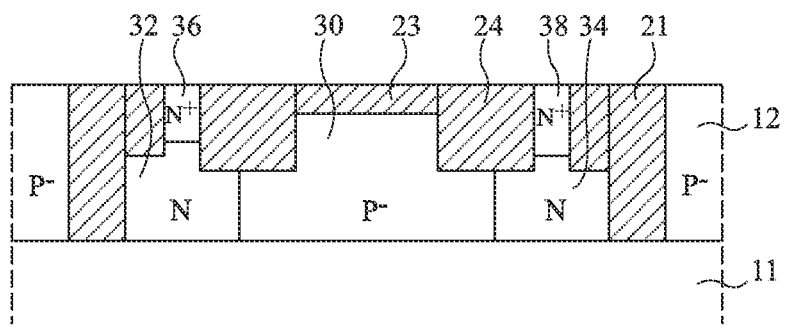

FIGS. 4A and 4B and 4C respectively are a top view and cross-section views of FIG. 4A along a plane BB and along a plane CC. These drawings show an embodiment of a protection component of bipolar transistor type. This component is formed in SOI layer 12 of chip 3 of FIGS. 1 and 3 and is associated with the waveguide described in relation with FIGS. 2A and 2B.

Figure 2B:
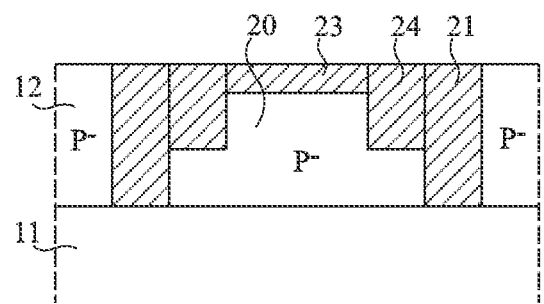
FIG. 2B is a cross-section view of FIG. 2A along plane BB.

The cross-section view of FIG. 4B is identical to that of FIG. 2B. It shows the same elements, that is, a waveguide formed of a silicon core 20 surrounded with silicon oxide.

In FIGS. 4A and 4C, to the left of a portion 30 of core 20 and in contact therewith, an N-type doped region 32 is formed in SOI layer 12. On the right-hand side of portion 30 of core 20 and in contact therewith, an N-type doped region 34 is formed in SOI layer 12. Portion 30 is a portion of the core length.

Trenches 21 follow the contour of the assembly formed of region 32, of region 34, and of core 20.

Above region 32, a heavily-doped N-type silicon region 36 ($N^+$) crosses upper insulating layer 24 and forms a contact with region 32. Similarly, above region 34, a heavily-doped N-type silicon region 38 ($N^+$) crosses upper insulating layer 24 and forms a contact with region 34.

Region 32, portion 30 of core 20, and region 34 respectively form the collector, base, and emitter regions of a bipolar transistor having its collector and its emitter connected across the element to be protected. This transistor, with a floating base in the shown embodiment, operates as a protection between its collector and its emitter.

Figure 5A:
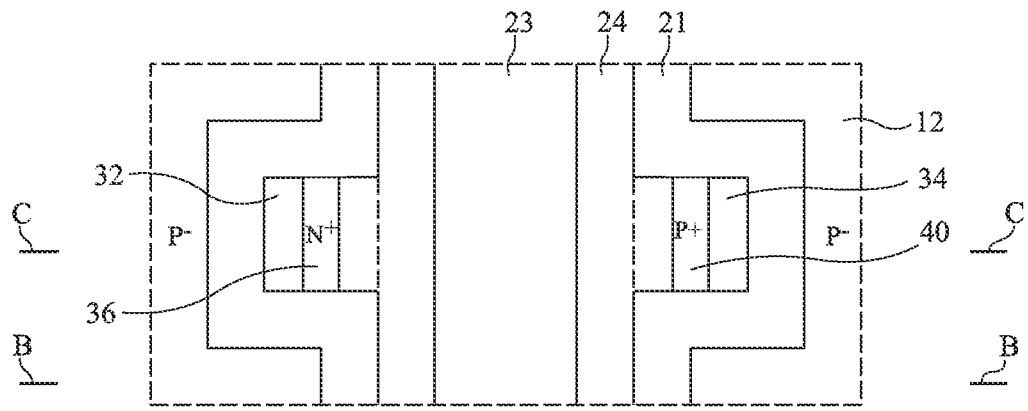
FIG. 5A is a top view of an embodiment of a protection component of unidirectional Shockley diode type.
Figure 5B:
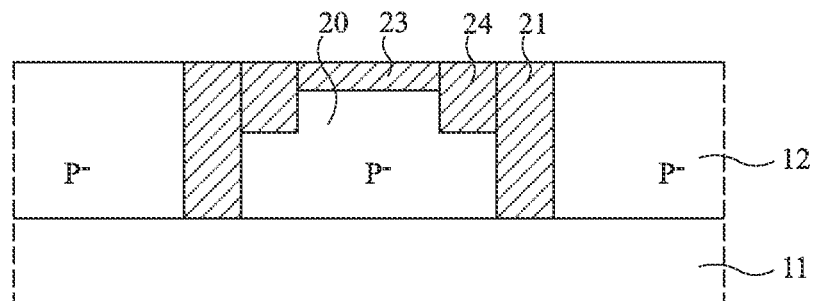
FIGS. 5B and 5C are cross-section views of FIG. 5A along plane BB and plane CC, respectively.
Figure 5C:
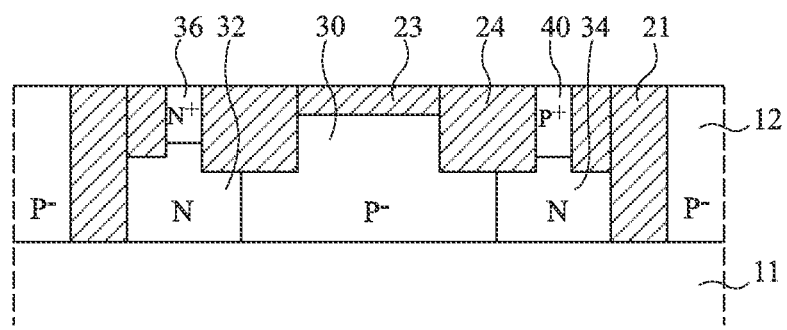

FIGS. 5A, 5B and 5C respectively are a top view and cross-section views of FIG. 5A along a plane BB and along a plane CC. These drawings show an embodiment of a protection component of unidirectional Shockley diode type (or gateless thyristor). This protection component is formed in SOI layer 12 of chip 3 of FIGS. 1 and 3 and is associated with the waveguide described in relation with FIGS. 2A and 2B.

The views of FIGS. 5A, 5B, and 5C illustrate the same elements as the views of FIGS. 4A, 4B, and 4C, designated with the same reference numerals. A difference with FIGS.

4A and 4C is that in FIGS. 5A and 5C, a heavily-doped P-type 40 (P+) replaces heavily-doped N-type region 38 (N+).

Region 40, region 34, portion 30 of core 20, and region 32 respectively form the anode, anode gate, cathode gate and cathode regions of a unidirectional Shockley diode. Anode region 40 and region 36, that is, cathode region 32, will be connected across the element to be protected.

Additionally, a heavily-doped N-type contacting region (N+) may be formed above region 34 to connect region 34 to anode region 40 of the Shockley diode to adjust its turn-on threshold.

Figure 6A:
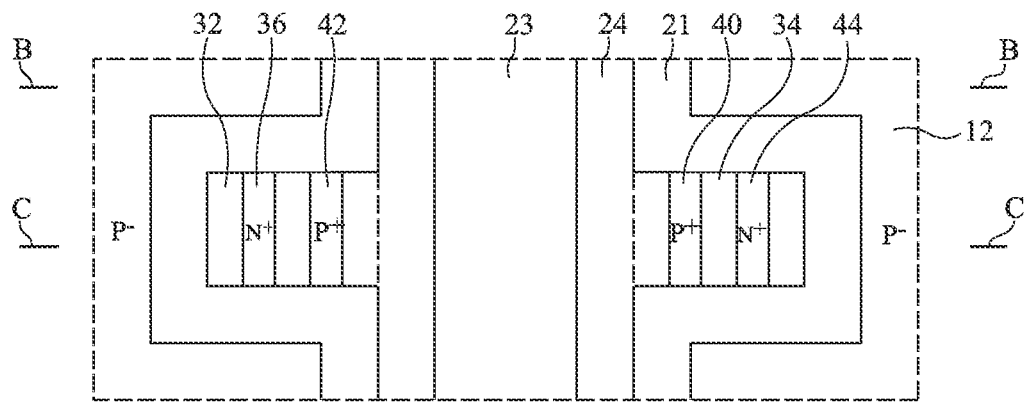
FIG. 6A is a top view of an embodiment of a protection component of bidirectional Shockley diode type.
Figure 6B:
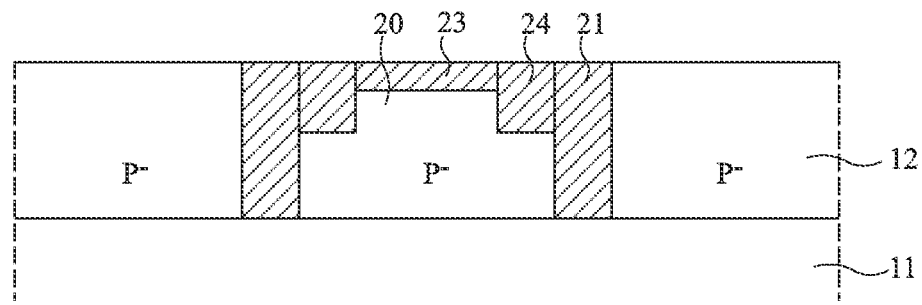
FIGS. 6B and 6C are cross-section views of FIG. 6A along plane BB and plane CC, respectively.
Figure 6C:
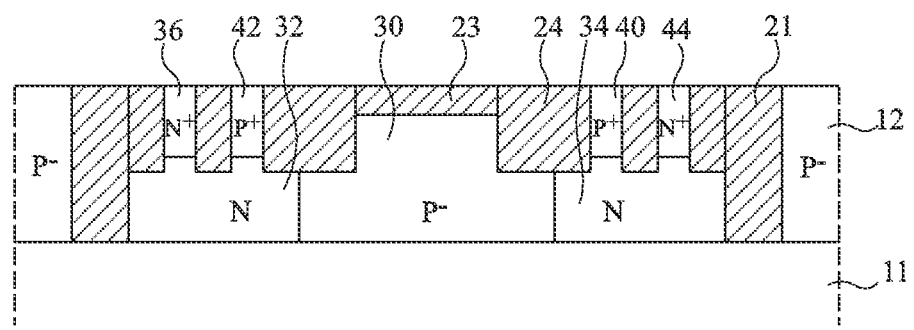

FIGS. 6A, 6B, and 6C respectively are a top view and cross-section views of FIG. 6A along a plane BB and along a plane CC. These drawings show an embodiment of a protection component of bidirectional Shockley diode type (or two gateless thyristors connected in antiparallel). This protection component is formed in SOI layer 12 of chip 3 of FIGS. 1 and 3 and is associated with the waveguide described in relation with FIGS. 2A and 2B.

The views of FIGS. 6A, 6B, and 6C illustrate the same elements as the views of FIGS. 5A, 5B, and 5C, designated with the same reference numerals.

In FIGS. 6A and 6C, a heavily-doped P-type silicon region 42 (P+) crosses upper oxide layer 24 above region 32 and forms a contact therewith. A heavily-doped N-type silicon region 44 (N+) crosses upper oxide layer 24 above region 34 and forms a contact therewith. In the above-described example, a portion of upper oxide layer 24 separates region 44 from heavily-doped P-type region 40 (P+). Similarly, region 42 is separated from region 36 by a portion of upper insulating layer 24.

Region 40, region 34, portion 30 of core 20, and region 32 respectively form the anode, anode gate, cathode gate and cathode regions of a first thyristor. Region 42, region 32, portion 30 of core 20, and region 34 respectively form the anode, anode gate, cathode gate and cathode regions of a second thyristor. Region 36 is connected to region 42 and region 40 is connected to region 44. Regions 42 and 40 will be connected across the element to be protected. The connection of the two thyristors in antiparallel forms a bidirectional Shockley diode.

In a technological process enabling to form optoelectronic circuits on SOI for example including optical waveguides, detection photodiodes, and fast phase modulators, the dimensions of the different layers will be:
  from 200 to 400 nm, for example 300 nm, for SOI layer 12,
  from 500 nm to 800 nm, for example 700 nm, for oxide layer 11, and
  in the order of half the thickness of SOI layer 12 for upper oxide layer 24, for example, 150 nm.

In an optoelectronic technological process, the forming of layers, areas, or regions having different doping levels is usually provided. Such areas, layers, or regions may be used to adjust the breakdown voltage of the protection components. The available doping concentrations will for example be:
  from $10^{15}$ to $10^{16}$ at./cm³ for lightly-doped P-type SOI layer 12 (P−),
  in the order of $10^{17}$ at./cm³ for N-type doped regions, and
  greater than $10^{19}$ at./cm³ for heavily-doped P-type regions (P+) and for heavily-doped N-type regions (N+).

Specific embodiments have been described. Various alterations and modifications will occur to those skilled in the art. In particular, although embodiments of assembly of integrated circuit chips have been described hereabove in relation with chips appended with an interposed interposer plate, the chips may be directly placed against each other.

It should be noted that chips 1 and 2 may be assembled with chip 3 before or after a step of sawing a wafer where chip 3 has been formed.

Although the device shown in FIGS. 1 and 3 illustrates an assembly of two chips 1 and 2 with chip 3, a single chip or more than two chips may be mounted on chip 3.

The conductivity types indicated as an example in relation with the above embodiment may all be inverted. The doping levels and the different layer thicknesses indicated as an example may be adapted according to the different technological processes used.

In embodiments of the protection components, a contact up to portion 30 of core 20 may be added to bias this portion and various optimizations may be performed at the junctions of the P-type doped and N-type doped regions to adjust the breakdown voltage of the protection components and thus obtain the desired voltage protection level.

In the above-described embodiments, the protection components are associated with an optical waveguide, a portion 30 of core 20 of the waveguide being used to form one of the regions of the protection components. Any portion of SOI layer 12 of chip 3, separate from core 20 of the waveguide, may as well be used to form this region of the protection components.

Further, the topography of the various elements may be modified by those skilled in the art. In particular, the thyristors and the triacs may have various topological variations.

Further, embodiments have been shown and described herein in the case where the concerned chips all are of SOI type, one of the chips (the chip comprising optoelectronic components) comprising a thicker SOI layer than the chips comprising "electronic" integrated circuits. It should be noted that embodiments may more generally apply to the case where it is not desirable to have protection components in a specific chip mounted on another chip. This for example occurs in the case where the "electronic" chip(s) are made of a material with which forming protection components is difficult or expensive, for example, in the case where this material is SiGe or a group III-V semiconductor. This also occurs, for example, in the case where the surfaces of the "electronic" chips already contain many components and where the addition of protection components would result in prohibitive chip dimensions.

Finally, it should again be underlined that an advantage of inserting all the protection components of several assembled chips in a single one of these chips is that this enables to protect the assembly against differential overvoltages capable of occurring between terminals of different chips.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A device, comprising:
   a plurality of integrated circuit chips mounted on one another,
   wherein an integrated circuit on a first chip of said plurality of integrated circuit chips includes an optoelectronic component;
   wherein an integrated circuit on a second chip of said plurality of integrated circuit chips includes an electric circuit component;
   wherein said first chip comprises a first silicon on insulator (SOI) layer having a first thickness;

wherein said second chip comprises a second SOI layer having a second thickness less than said first thickness;
said first chip further including at least one component configured to protect elements of at least one second chip.

2. The device of claim 1, wherein the first chip and said second chip are placed directly against each other.

3. The device of claim 1, wherein the first chip and said second chip are appended with an interposed interposer plate, wherein surfaces of each of the chips supporting the SOI layer are opposite.

4. The device of claim 1, wherein at least one of the protection components is connected to terminals of different chips.

5. The device of claim 1, wherein said at least one protection component is formed in the first SOI layer and comprises:
a first region of a first conductivity type, and
a second region and a third region of the second conductivity type arranged on either side of the first region,
the first region, the second region, and the third region altogether forming a bipolar transistor.

6. The device of claim 1, wherein said at least one protection component is formed in the first SOI layer and comprises:
a first region of a first conductivity type,
a second region and a fourth region respectively of the second conductivity type and of the first conductivity type successively arranged on one side of the first region, and
a third region of the second conductivity type arranged on the other side of the first region,
the first region, the second region, the third region, and the fourth region altogether forming a unidirectional Shockley diode.

7. The device of claim 1, wherein said at least one protection component is formed in the first SOI layer and comprises:
a first region of a first conductivity type,
a second region and a fourth region respectively of the second conductivity type and of the first conductivity type successively arranged on one side of the first region, and
a third region and a fifth region respectively of the second conductivity type and of the first conductivity type successively arranged on the other side of the first region,
the first region, the second region, the third region, the fourth region, and the fifth region altogether forming a bidirectional Shockley diode.

8. The device of claim 7, wherein the first region is a portion at least of the core of a waveguide formed in said first SOI layer.

9. The device of claim 5, wherein the first region is a portion at least of the core of a waveguide formed in said first SOI layer.

10. The device of claim 6, wherein the first region is a portion at least of the core of a waveguide formed in said first SOI layer.

11. A device, comprising:
a first integrated circuit chip including an optoelectronic component and an electrostatic discharge protection component supported by a first silicon on insulator (SOI) layer having a first thickness; and
a second integrated circuit chip including a first electric circuit component supported by a second SOI layer having a second thickness less than said first thickness;
wherein the first and second integrated circuit chips are mounted to each another with the electrostatic discharge protection component electrically connected to the first electric circuit component such that the electrostatic discharge protection component is configured to provide electrostatic discharge protection for the first electric circuit component.

12. The device of claim 11, wherein the first integrated circuit chip and the second integrated circuit chip are placed directly against each other.

13. The device of claim 11, further comprising an interposed interposer plate positioned between the first integrated circuit chip and the second integrated circuit chip.

14. The device of claim 11, further comprising a third integrated circuit chip including a second electric circuit component supported by a third SOI layer having a third thickness less than said first thickness, said third integrated circuit chip mounted to the first integrated circuit chip, wherein the electrostatic discharge protection component is electrically connected to the second electric circuit component such that the electrostatic discharge protection component is configured to provide electrostatic discharge protection for the second electric circuit component.

15. The device of claim 11, wherein said electrostatic discharge protection component comprises:
a first region of a first conductivity type, and
a second region and a third region of the second conductivity type arranged on either side of the first region,
the first region, the second region, and the third region altogether forming a bipolar transistor.

16. The device of claim 15, wherein the first region is a portion at least of a core of a waveguide formed in said first SOI layer.

17. The device of claim 11, wherein said electrostatic discharge protection component comprises:
a first region of a first conductivity type,
a second region and a fourth region respectively of the second conductivity type and of the first conductivity type successively arranged on one side of the first region, and
a third region of the second conductivity type arranged on the other side of the first region,
the first region, the second region, the third region, and the fourth region altogether forming a unidirectional Shockley diode.

18. The device of claim 17, wherein the first region is a portion at least of a core of a waveguide formed in said first SOI layer.

19. The device of claim 11, wherein said electrostatic discharge protection component comprises:
a first region of a first conductivity type,
a second region and a fourth region respectively of the second conductivity type and of the first conductivity type successively arranged on one side of the first region, and
a third region and a fifth region respectively of the second conductivity type and of the first conductivity type successively arranged on the other side of the first region,
the first region, the second region, the third region, the fourth region, and the fifth region altogether forming a bidirectional Shockley diode.

20. The device of claim 19, wherein the first region is a portion at least of the core of a waveguide formed in said first SOI layer.

21. The device of claim 11,
wherein the optoelectronic component is an optical waveguide formed in said first SOI layer and comprising a first region of said first SOI layer doped with a first conductivity type and laterally delimited by two outside insulating regions extending completely through the first SOI layer, the optical waveguide further defined by an upper insulating layer positioned between the outside insulating regions; and wherein said electrostatic discharge protection component comprises a second region of said first SOI layer doped with a second conductivity type positioned adjacent and in contact with the first region and a third region of said first SOI layer more heavily doped with said second conductivity type positioned above and in contact with said second region, the third region being insulated from the first region by said upper insulating layer and further positioned between said upper insulating layer and one of the two outside insulating regions.

22. The device of claim 21, wherein said electrostatic discharge protection component further comprises a fourth region of said first SOI layer doped with the second conductivity type positioned adjacent and in contact with the first region and a fifth region of said first SOI layer doped with the first conductivity type positioned above and in contact with said fourth region, wherein the fifth region is insulated from the first region by said upper insulating layer and is further positioned between said upper insulating layer and one of the two outside insulating regions.

23. The device of claim 22, wherein said electrostatic discharge protection component further comprises a sixth region of said first SOI layer more heavily doped with said second conductivity type positioned above and in contact with fourth region and wherein said upper insulating layer is configured with an insulating region positioned between said fifth and sixth regions so as to insulate the fifth and sixth regions from each other.

24. The device of claim 21, wherein said electrostatic discharge protection component further comprises a fourth region of said first SOI layer doped with the second conductivity type positioned adjacent and in contact with the first region and a fifth region of said silicon layer more heavily doped with said second conductivity type positioned above and in contact with said fourth region, wherein the fifth region is insulated from the first region by said upper insulating layer and is further positioned between said upper insulating layer and one of the two outside insulating regions.

25. The device of claim 24, wherein the third and fifth regions are on opposite sides of, and are insulated from each other by, the upper insulating layer.

26. The device of claim 21, wherein the electrostatic discharge protection component further comprises a fourth region of said silicon layer doped with the first conductivity type positioned above and in contact with said second region and wherein said upper insulating layer is configured with an insulating region positioned between said third and fourth regions so as to insulate the third and fourth regions from each other.

* * * * *